United States Patent [19]

Oda et al.

[11] Patent Number: 5,435,903
[45] Date of Patent: Jul. 25, 1995

[54] PROCESS FOR THE ELECTRODEPOSITION OF AN AMORPHOUS COBALT-IRON-PHOSPHORUS ALLOY

[75] Inventors: Masaharu Oda; Hidehiko Ohashi; Kensuke Kamada, all of Hiroshima, Japan

[73] Assignee: Mitsubishi Rayon Company, Ltd., Japan

[21] Appl. No.: 974,668

[22] Filed: Nov. 12, 1992

Related U.S. Application Data

[62] Division of Ser. No. 551,309, Jul. 12, 1990, abandoned.

[30] Foreign Application Priority Data

Oct. 12, 1989 [JP] Japan .................. 1-263975
Oct. 12, 1989 [JP] Japan .................. 1-263976

[51] Int. Cl.$^6$ .......................... C25D 1/04; C25D 3/56
[52] U.S. Cl. ................................ 205/77; 205/258
[58] Field of Search ............. 205/258, 76, 77, 259

[56] References Cited

U.S. PATENT DOCUMENTS

| | | | |
|---|---|---|---|
| Re. 30,106 | 10/1979 | Polk et al. | 204/23 |
| 3,637,471 | 1/1972 | Faulkner | 204/44.7 |
| 4,079,430 | 3/1978 | Fujishima et al. | 148/304 |
| 4,101,389 | 7/1978 | Uedaira | 204/44 |
| 4,231,816 | 11/1980 | Cuomo et al. | 148/304 |
| 4,236,946 | 12/1980 | Aboaf et al. | 148/304 |
| 4,368,447 | 1/1983 | Inomata et al. | 148/304 |
| 4,396,575 | 8/1983 | Aboaf et al. | 428/606 |
| 4,420,348 | 12/1983 | Shiiki et al. | 148/304 |
| 4,529,486 | 7/1985 | Polan | 205/77 |
| 4,746,412 | 5/1988 | Uchida et al. | 204/44.7 |
| 4,859,256 | 8/1989 | Sawa et al. | 428/606 |
| 4,865,664 | 9/1989 | Sato et al. | 148/403 |
| 4,908,280 | 3/1990 | Omura et al. | 428/679 |
| 5,096,513 | 3/1992 | Sawa et al. | 148/304 |

FOREIGN PATENT DOCUMENTS

| | | |
|---|---|---|
| 52-140403 | 11/1977 | Japan . |
| 55-164092 | 12/1980 | Japan . |
| 57-41389 | 3/1982 | Japan ................. C24B 11/06 |
| 58-048652 | 3/1983 | Japan ................. 148/304 |
| 60-33382 | 2/1985 | Japan . |
| 63-10235 | 1/1988 | Japan . |
| 1247589 | 10/1989 | Japan . |
| 1247590 | 10/1989 | Japan . |
| 270085 | 3/1990 | Japan . |

OTHER PUBLICATIONS

J. S. Judge, "Control of Magnetic Properties...", IBM Technical Disclosure Bulletin, vol. 6, No. 11, Apr. 1964, pp. 5–6.
M. Yagi et al, J. Appl. Phys. 64, 6050 (1988).
E. M. Gyorgy: "Metallic Glasses", American Society for Metals, pp. 275–303 (1978).
Yamauchi, Collection of Lectures of '89 Switching Power Source System Symposium, 5-2-1 to 5-2-7.
"Ferroxplana", G. H. Jonker et al: Philips. Tech. Rev., 18 (1956), 145.

*Primary Examiner*—John Niebling
*Assistant Examiner*—William T. Leader
*Attorney, Agent, or Firm*—Finnegan, Henderson, Farabow, Garrett & Dunner

[57] ABSTRACT

A thin amorphous alloy of cobalt, iron and phosphorus having good workability and the ability to be used as a soft magnetic material is formed by electrolytic deposition. The electrolytic bath has a pH of 1.0 to 2.2 and contains at least a divalent cobalt ion, a divalent iron ion, and phosphorous acid and/or a phosphite. The amorphous alloy contains at least 69 atomic percent cobalt, 2 to 30 atomic percent phosphorus and the iron/(cobalt+iron) atomic ratio is from 0.001 to 0.1. The alloy may be deposited on a working electrode having a chrome-plated surface with a center line average roughness of less than 1 $\mu m$ and may be peeled from the electrode to obtain a tape-shaped or foil-shaped product.

3 Claims, 10 Drawing Sheets

X-RAY DIFFRACTION CHART OF AMORPHOUS ALLOY C

DIFFUSION ANGLE 2θ (°)

SURFACE ROUGHNESS OF AMORPHOUS ALLOY FORMED BY RAPID COOLING PROCESS

SURFACE ROUGHNESS OF AMORPHOUS ALLOY OF PRESENT INVENTION

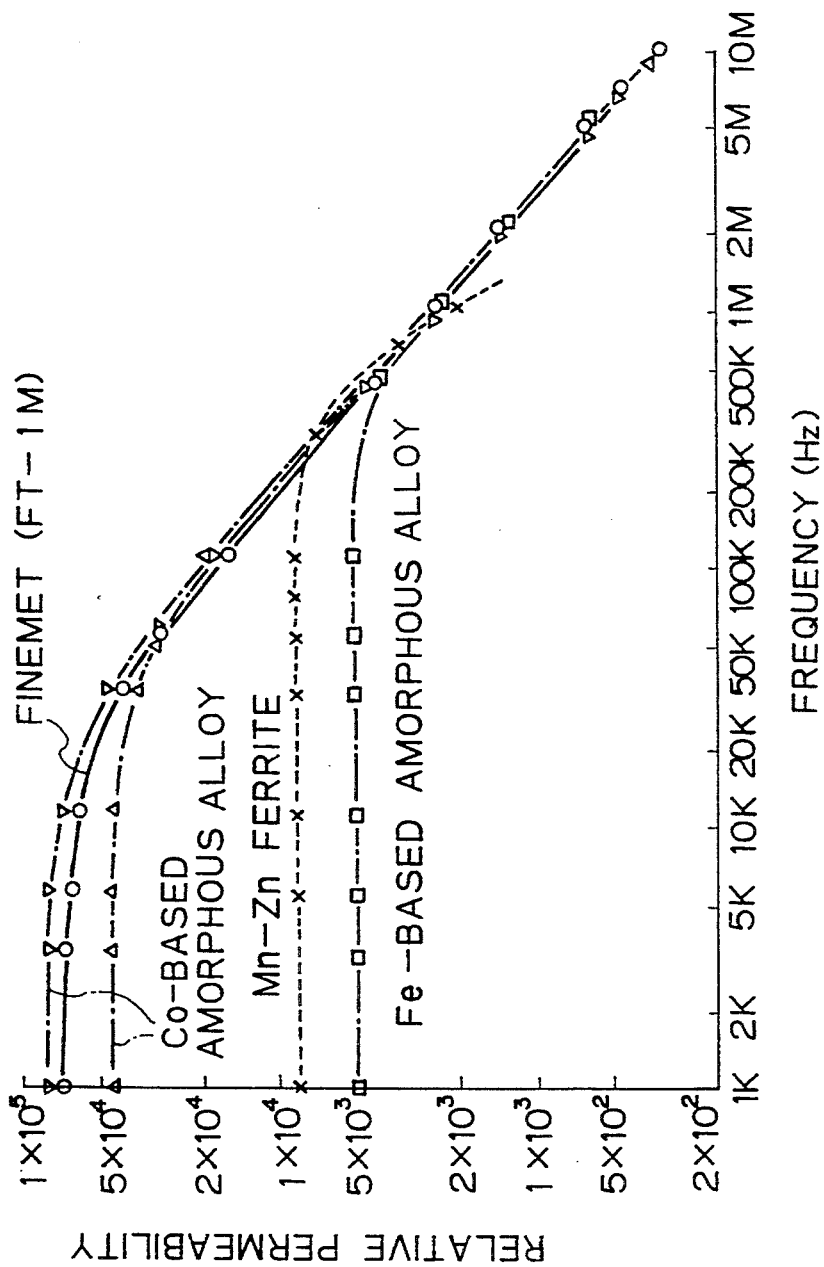

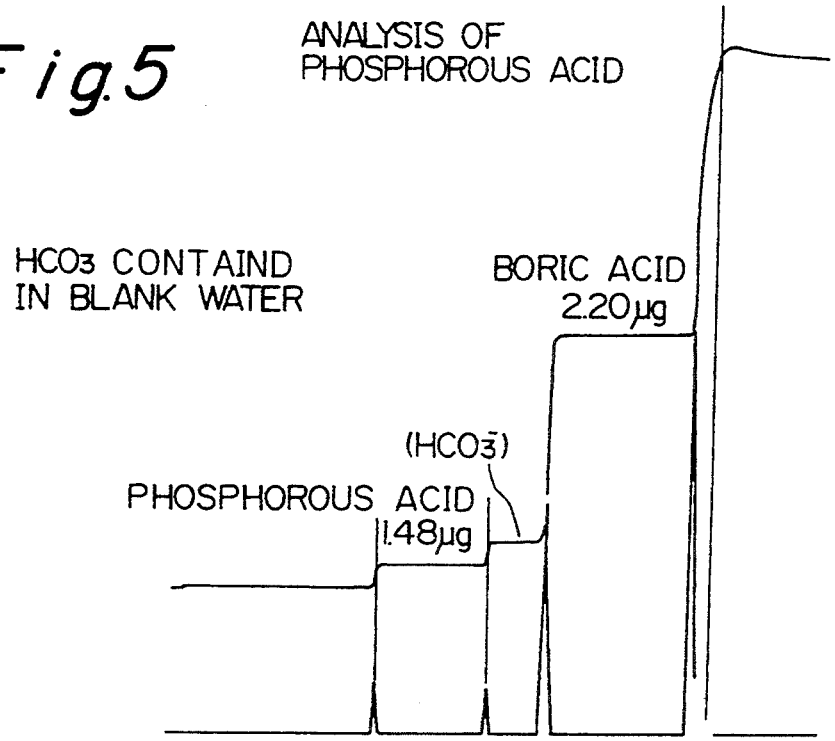
Fig.5 ANALYSIS OF PHOSPHOROUS ACID
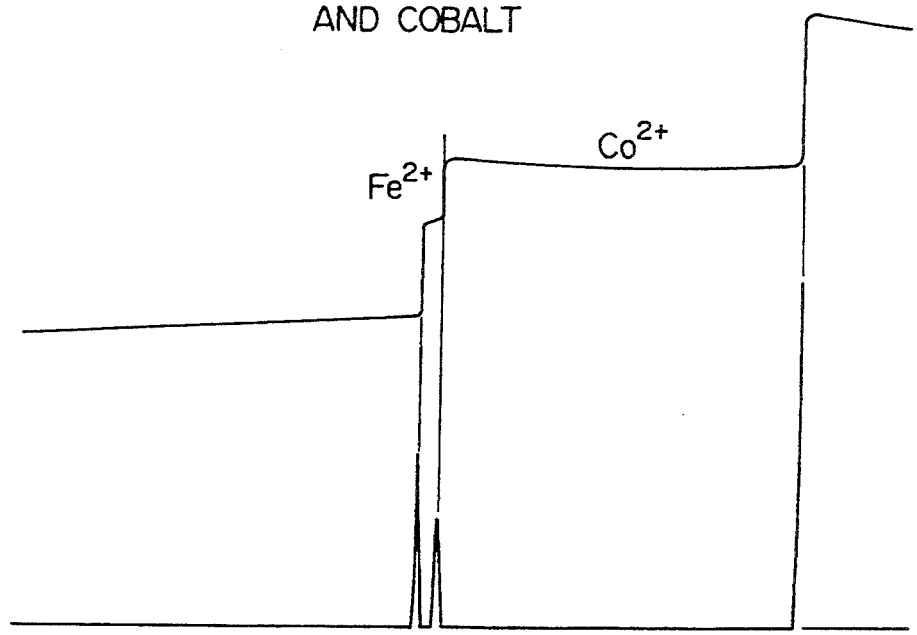
Fig.6 ANALYSIS OF IRON AND COBALT

RELATION SHIP BETWEEN THICKNESS
AND PERMEABILITY IN AMORPHOUS ALLOY

Fig.10
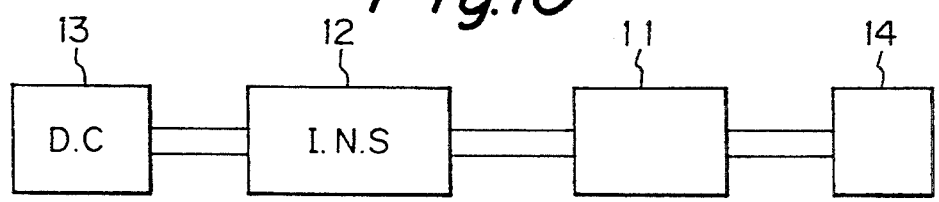
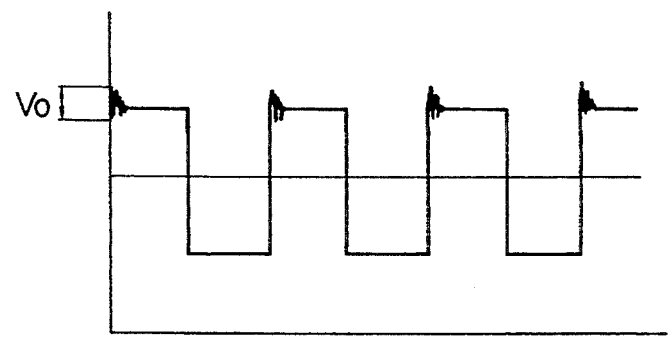
OSCILLOSCOPE DIAGRAM
Fig.11
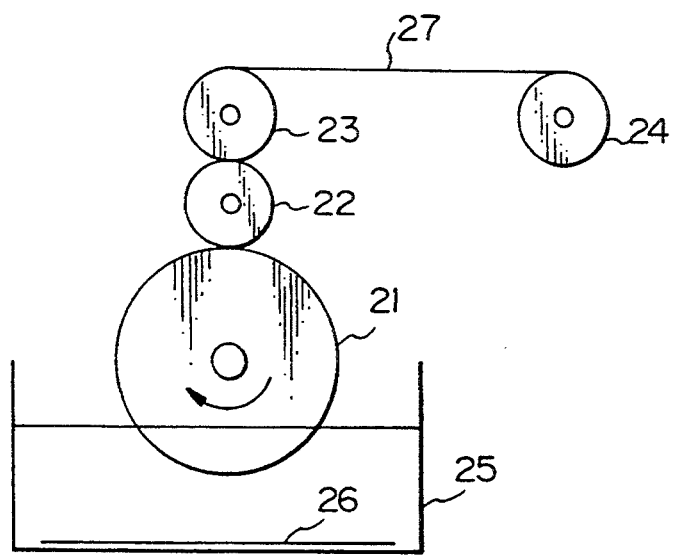

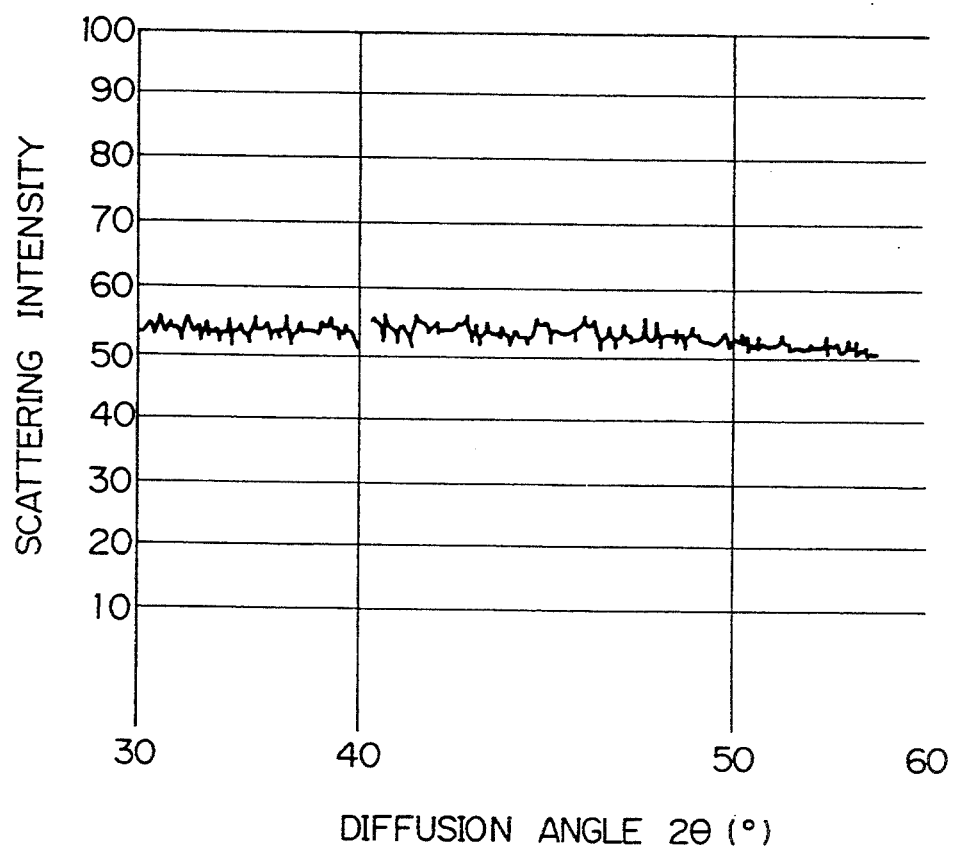

PROCESS FOR THE ELECTRODEPOSITION OF AN AMORPHOUS COBALT-IRON-PHOSPHORUS ALLOY

This application is a division of application Ser. No. 07/551,309, filed Jul. 12, 1990, now abandoned.

BACKGROUND OF THE INVENTION

1. Field of the Invention

The present invention relates to a thin amorphous alloy film or covering film having a good workability and able to be used as a soft magnetic material, and a process for the preparation thereof.

2. Description of the Related Art

In an amorphous alloy, the arrangement of atoms is irregular and the amorphous alloy lacks the long periodicity of and differs in structural characteristic from a crystalline alloy in the non-existence of a crystal grain boundary or a lattice defect, and therefore, the amorphous alloy has superior magnetic characteristics and the application of the amorphous alloy as a low hysteresis loss material or a high permeability material is under consideration. For example, the application of an Fe-based amorphous alloy to a core of a transformer is considered because this amorphous alloy has a high saturation flux density and a low hysteresis loss, and accordingly, when this alloy is used, the hysteresis loss is much lower than in a transformer having a conventional core composed of a silicon steel sheet, and good characteristics can be obtained. Furthermore, a Co-based amorphous alloy is characterized in that the coercive force is low over a broad frequency band region, and this amorphous alloy can be effectively used as a magnetic core material for a magnetic amplifier.

The most popular process for the preparation of an amorphous alloy is a rapid quenching process, whereby a melted metal is quickly guided onto a cooled rotary drum and rapidly quenched at a cooling rate of about $10^5$ to about $10^6$ deg/sec, to solidify the melt without allowing time for a crystallization thereof, whereby an amorphous alloy is formed. In general, however, the amorphous alloy formed by this rapid quenching process is limited to a thickness of scores of $\mu m$, because undulations are formed on the surface when the melted metal is guided onto the drum, and thus it is difficult to obtain a thin product. As a means of eliminating these undulations, a process was proposed in which a melted metal is placed in contact with a cooled plate surface under a high vacuum, and has been reported that a thin film having a thickness of about 6 $\mu m$ can be obtained by this process [M. Yagi et al, J. Appl. Phys., 64, 6050 (1988)]. If such a thin film can be obtained, the eddy current can be reduced and a material having a lower hysteresis loss and a higher permeability can be obtained. In this process, however, a high vacuum is necessary and a large-scale apparatus must be used, and thus it is impossible to continuously prepare a foil. Therefore, the process is not industrially utilizable.

Other known processes for the preparation of an amorphous alloy are a sputtering process, an ion plating process, and a vacuum evaporation deposition process, and although thin films can be obtained by these processes, the speed of the growth of the amorphous alloy and the productivity are low, and the preparation apparatus is expensive and requires a large installation area. Accordingly, these processes are not suitable for mass production. Furthermore, according to these processes, it is difficult to recover a product in a form suitable for a wide range of applications, such as a tape-shaped film or a metal foil, and therefore, the product can be used only when deposited on a substrate having an intended form.

Recently, attempts have been made to utilize an electric plating or electroless plating process in which an amorphous alloy is obtained by depositing a metal ion or metalloid ion contained in a solution by electrolytic deposition or chemical reduction (see Japanese Unexamined Patent Publication No. 52-140403 and Japanese Unexamined Patent Publication No. 55-164092).

In the field of soft magnetic materials, a material having a low loss, a high conversion efficiency, and superior high-frequency characteristics are required, and to obtain these characteristics, the magneto-striction, one of the magnetic characteristic parameters, must be reduced as much as possible. The amplitude of the magneto-striction has a close relationship to the composition of the alloy, and it is well-known that the compositions of ferromagnetic elements giving a magneto-striction of zero are Fe/Co (6/94), Fe/Ni (18/82) and Co/Ni (46/54). Among these compositions, the Fe/Co system having a high saturation flux density is considered an excellent soft magnetic material, and based on this consideration, a process for the deposition by the plating method of an amorphous alloy composed mainly of Co has been developed. For example, Japanese Examined Patent Publication No. 63-10235 discloses a process in which an electric current having a density of 5 to 20 $A/dm^2$ is applied to an acidic plating bath having a pH value of 1.2 to 2.2, which comprises, as main ingredients, about 1/6 to about 3 moles/l of a divalent cobalt ion and about 0.03 to about 0.3 mole/l of hypophosphorus acid and/or a hypophosphite, to effect the electroplating, whereby an amorphous alloy composed mainly of cobalt and phosphorus is deposited.

Currently, improvements of the characteristics in the high-frequency region are especially required for a soft magnetic material to be used as a magnetic core or the like, and as described above, if a high-frequency exciting current flows in a magnetic layer, usually the quantity of an eddy current flowing in the magnetic layer is increased, resulting in increase of the loss. Accordingly, as the frequency is increased, the permeability is reduced and the coercive force is increased. The eddy current is in inverse proportion to the resistivity of the magnetic layer; i.e., in the same material, the eddy current is in proportion to the thickness of the magnetic layer, and a thinner magnetic layer has better characteristics.

For an industrial product, the ability to be easily and precisely formed into an intended shape and size is important not only for increasing the productivity and reducing costs but also for improved performances. Accordingly, a tape-shaped, sheet-shaped or foil-shaped material having a good surface smoothness has superior general-purpose properties. For example, when applied to a magnetic head, a magnetic material is produced in a -shaped form by pressing, and the shaped pieces are laminated, welded and integrally joined by using a laser beam or the like. This application can be greatly facilitated if the magnetic material is in the form of a tape, sheet or foil.

Note, Japanese Examined Patent Publication No. 63-10235 mentioned above does not disclose a specific process for forming an amorphous alloy foil. Namely, in the process disclosed in Japanese Examined Patent Publication No. 63-10235, phosphorus added to the alloy for stabilizing the amorphous state of the alloy is supplied from hypophosphorous acid and/or a hypophosphite contained in the plating solution, but when hypophosphorous acid and/or a hypophosphite is used as the phosphorus-supplying agent, the phosphorus concentration range at which a good film-forming state can be maintained is very narrow and the process is defective in that the operation range is restricted. Moreover, this process does not have a satisfactory film-forming property, and accordingly, it is difficult to obtain a very thin film. Therefore, it is substantially impossible to obtain a very thin film having a reduced eddy current loss and superior magnetic characteristics.

SUMMARY OF THE INVENTION

Considering the above-mentioned background, the object of this invention is to obtain an amorphous alloy thin film or covering film having superior magnetic characteristics and a very thin thickness, and it has been found this object can be realized by an amorphous alloy of the Fe—Co system obtained by using a plating solution containing phosphorous acid or salt thereof as the source of supply of phosphorus into the alloy. The present invention is based on this finding.

More specifically, in accordance with a first aspect of the present invention, there is provided an amorphous alloy formed by the electrolytic deposition, which comprises at least iron and cobalt as alloying ingredients, wherein the atomic ratio of cobalt in the alloy is at least 90% based on iron and cobalt and the thickness of the alloy is less than 20 μm. The surface of this alloy is very smooth, and the center line average height of the surface is less than 0.5 μm.

In accordance with a second aspect of the present invention, there is provided an ultra-thin amorphous alloy film in the form of a continuous tape or foil, or a covering film formed on the surface of an electroconductive material. As the electroconductive material surface on which the covering film is formed, there can be mentioned a carbon fiber surface and an electroconductive pattern of a printed circuit board, which are appropriately selected according to the intended use. Furthermore, a laminate comprising at least two layers of different materials can be used.

In accordance with a third aspect of the present invention, there is provided an amorphous alloy having a high resistivity and superior high-frequency magnetic characteristics, wherein the resistivity is at least 50 μΩ.cm and the following relationship is established between the initial permeability $\mu$ and the exciting frequency f (Hz):

$$\log_{10}\mu > 8.9 - 0.9\log_{10}f$$

In accordance with a fourth aspect of the present invention, there is provided a process for forming an amorphous alloy comprising iron and cobalt on an electrode by the electrolytic deposition, wherein the electrolysis is carried out in an acidic electrolytic bath comprising at least a divalent cobalt ion, a divalent iron ion, and phosphorous acid and/or a phosphite to electrolytically deposit an amorphous alloy comprising Co, Fe and P as main components, in which Fe/(Co+Fe) content is 0.1 to 20 atomic % and the P content is 3 to 30 atomic %. Also, an electrolytic bath further comprising a reducing agent or a complexing agent can be used.

In accordance with a fifth aspect of the present invention, there is provided a process for forming an amorphous alloy on an electrode by electrolytic deposition, wherein a metal having a mirror-finished surface such that the center line average height is less than 1 μm is used as the electrode and the amorphous alloy formed on the electrode is peeled from the electrode to obtain a tape-shaped or foil-shaped amorphous alloy. Preferably, a hard chrome-plated surface is used as the metal surface of the working electrode.

BRIEF DESCRIPTION OF THE DRAWINGS

FIG. 2 shows the dependency of the relative permeability on the frequency;

FIG. 5 shows the results of the ion quantitative analysis of the electrolytic bath of Example 1;

FIG. 6 shows the results of the ion quantitative analysis of the electrolytic bath of Example 1 after being used for the electrolysis;

FIG. 10 illustrates an outline of an apparatus for measuring the noise damping factor;

FIG. 11 illustrates an outline of a continuous plating apparatus; and,

FIG. 12 is an X-ray diffraction chart of an amorphous alloy C.

DESCRIPTION OF THE PREFERRED EMBODIMENTS

During research into the developing of a material having superior soft magnetic characteristics, the present inventors found that a material satisfying the requirements described below has such superior soft magnetic characteristics, and further, succeeded in developing a process for preparing this material, and thus completed the present invention.

The above-mentioned requirements are as follows:

(1) The alloy composition must have superior soft magnetic characteristics. As pointed out hereinbefore, to reduce the loss and impart superior high-frequency characteristics, the magneto-striction, a parameter of the magnetic characteristics, must be reduced as much as possible. An iron-cobalt alloy having a cobalt content of at least 90% has a very small magneto-striction and has a higher saturation flux density than an alloy comprising another element, and therefore, an alloy comprising iron and cobalt as the main ingredients is preferable. Nevertheless, a minor amount of another element may be incorporated if desired.

(2) The alloy must have a high electrical resistance. A usual metal has a low electrical resistance, and thus the problem of a loss due to an eddy current arises. An amorphous alloy is preferably used for obtaining a magnetic film having superior high-frequency characteristics, since the electrical resistance of the amorphous alloy is about 100 times higher than that of a usual crystalline alloy. Preferably, the resistivity at normal temperature is at least 50 μΩ.cm, especially at least 100 μΩ.cm.

(3) The film must be thin, since the magnetic loss at a high frequency is dominated by the eddy current loss. The eddy current loss (W) is represented by the following formula:

$$W = \frac{\pi^2}{6\rho} \cdot f^2 \cdot Bm^2 \cdot t^2$$

wherein p represents the resistivity, f represents the frequency, Bm represents the exciting flux density, and t represents the thickness.

As apparent from the above formula, the thinner the thickness, the smaller is W. To obtain superior magnetic characteristics, preferably the thickness is less than 10 μm, more preferably less than 5 μm, most preferably less than 2 μm.

(4) The surface of the film must be smooth since, at a high frequency, the magnetic domain is easily pinned by surface undulations, resulting in poor magnetic characteristics. According to the theory advanced by Gyorgy et al [E. M. Gyorgy: "Metallic Glasses", American Society for Metals, 275 (1978)], the surface roughness is approximated to a trigonal pyramid having a width of 2× and a depth of a, and the coercive force (Hc) is calculated according to the following formula:

$$Hc = \frac{2(AK)^{\frac{1}{2}} \cdot S}{Mo \cdot d}$$

wherein A represents the austausch stiffness coefficient, K represents the anisotropic magnetic field, Mo represents the saturation magnetization, d represents the sample thickness, and S represents a dimentionless constant that describes the details of the surface roughness.

Figure 1A:
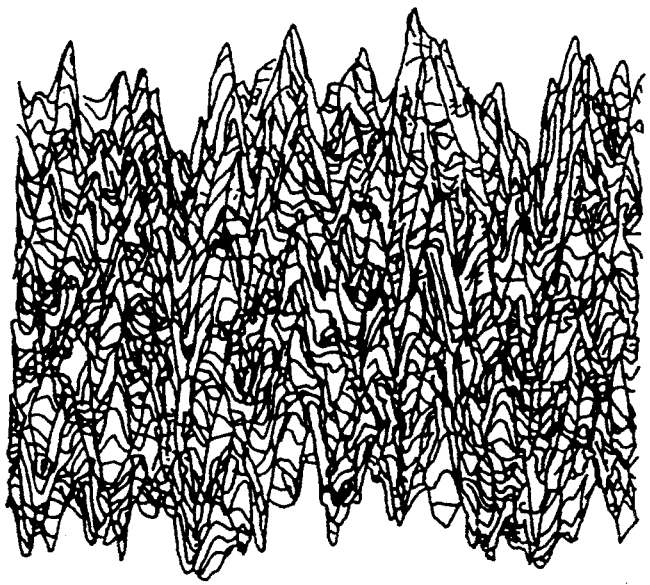
FIG. 1A shows the surface roughness of an amorphous alloy formed by the rapid cooling process.

The loss is greater when the surface undulations are larger. FIG. 1A shows the surface condition of a commercially available amorphous alloy obtained by the rapid quenching process, as determined by the tracer method. This amorphous alloy having such large surface undulations cannot be given superior high-frequency characteristics. Preferably, the surface roughness is such that the center line average height is less than 0.5 μm.

(5) The number of magnetic domain walls must be large. The number of magnetic domain walls must be increased by forming a dense microstructure in the interior of the magnetic film. It is easily understood from the following formula that the eddy current loss is greatly influenced by the number of magnetic domain walls.

$$W = \frac{Ck}{\rho} \cdot \frac{f^2 Bm^2}{n}$$

wherein Ck is a constant and n is the number of magnetic domain walls.

(6) The magnetic anisotropy must be small. The initial permeability μ based on the assumption of the rotational magnetization process is represented by the following formula (Chikazumi, "Physics of Ferromagnetic Materials" published by Shokabo):

$$\mu = \frac{Is^2}{3\mu_0 Ku}$$

wherein Is represents the spontaneous magnetization, μo represents the permeability in vacuo, and Ku represents the anisotropic energy.

As the Ku becomes smaller, the permeability becomes higher, and where the formed amorphous alloy is taken out, as in the rapid cooling process, the magnetic anisotropy is generated by the internal stress and satisfactory products cannot be obtained.

The present invention provides a material satisfying all of the foregoing requirements, and a process for preparing this material. The material and process of the present invention will now be described in detail.

An amorphous alloy formed by the electrolytic deposition will realize the objects of the present invention, for the following reasons:

(i) Mass production is possible with a high level of production, and when the preparation process of the present invention is used, a separate film in the form of a tape or foil can be continuously prepared.

Figure 1B:
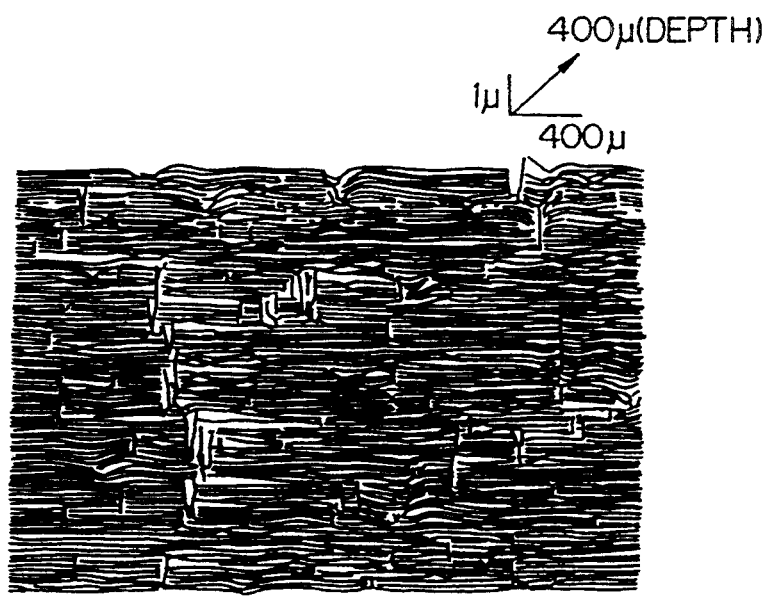
FIG. 1B shows the surface roughness of an amorphous alloy according to the process of the present invention.

(ii) A film having a very smooth surface can be obtained. Namely if the electrolytic conditions and electrode surface conditions of the present invention are adopted, a film having a very smooth surface, as shown in FIG. 1B, can be obtained.

(iii) Since an unreasonable external force is not imposed during the preparation in the electrolytic deposition process, the magnetic anisotropy due to internal stress is not generated and a highly isotropic film can be obtained.

(iv) When the deposition of an alloy in the electrolytic deposition process is examined, it can be seen that many atomic nuclei are formed just after the electrolysis, and the deposition of the alloy is advanced with these nuclei as the centers. Therefore, it is assumed that a dense and fine structure is formed in the deposited film. In the rapid quenching process, an amorphous alloy is formed by solidifying a melted liquid metal, and therefore, this amorphous alloy cannot have such a structure. The forming of this dense and fine structure by the electrolytic process, increases the number of magnetic domain walls.

For the reasons set forth above, the above-mentioned requirements (3), (4), (5) and (6) can be satisfied if the electrolytic deposition conditions of the present invention are adopted, and as a result, an amorphous alloy having superior magnetic characteristics can be obtained. In the preparation process disclosed in Japanese Examined Patent Publication No. 63-10235, as mentioned above, the film-forming property is poor and it is difficult to obtain a uniform film, and it is very difficult to determine electrolytic conditions satisfying all of the foregoing requirements.

The permeability is a parameter characterizing the soft magnetic material, and FIG. 2 shows the dependency of the relative permeability μ of a magnetic material in practical use on the frequency f (Yamauchi, Collection of Lectures of '89 Switching Power Source System Symposium, 5-2-1). As can be seen, when the frequency is increased, the relative permeability is reduced, and this reduction is along substantially the same line in all of the magnetic materials regardless of the difference of the amplitude, and thus the characteristics of the magnetic materials become poor at higher frequencies. The development of a magnetic material capable of being used at a higher frequency has been attempted, and a material called "Ferroxplana" developed [G. H. Jonker et al: Philips. Tech. Rev., 8 (1956), 145). Nevertheless, it is difficult to sufficiently increase the resistivity of this material, and the eddy current loss thereof is large, and thus a special crystal growth means becomes necessary and the preparation is made difficult. Therefore, currently, this material is not practically used.

In the amorphous alloy of the present invention, the following relationship crossing this boundary line is established between the initial permeability ($\mu$) and the exciting frequency (f):

$$\log_{10}\mu > 8.9 - 0.9\log_{10}f$$

Namely, the amorphous alloy of the present invention has a high resistivity and shows a high initial permeability $\mu$ at a high frequency.

As apparent from the foregoing description, the amorphous alloy of the present invention is a superior soft magnetic material, and the performances thereof can be further improved by incorporating a minor amount of another metal, according to the intended use. For example, a small amount of chromium can be added to improve the corrosion resistance as well as the magnetic characteristics, and a small amount of tungsten can be added to improve the heat resistance. The amorphous alloy of the present invention is generally represented by the following formula:

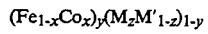

$$(Fe_{1-x}Co_x)_y(M_zM'_{1-z})_{1-y}$$

wherein x is a number of $x \geq 0.9$, y is a number of $0 < y < 1$, z is a number of $0 \leq z < 1$, M is at least one metal selected from the group consisting of Mn, Ni, Ag, Cr, W, Cu, Al, Zn, Cd, Mo, Au, Pt, In, Pd, Zr, Ru, Ti, Hf, Sn, Sb, and Bi, preferably, Ni, Ag, Cr, W, Cu, Zn Mo, and Sn, and M' is at least one metalloid selected from the group consisting of P, B, As, Ge, Si, Te, S, and Se, preferably, P, B, and S.

The amorphous alloy of the present invention can be used for covering the surfaces of various materials, according to the intended use. For example, since a carbon fiber has a light weight and superior mechanical characteristics, the carbon fiber is widely used as the structural material, and recently, attempts have been made to form an electromagnetic shielding material by covering the surface of the carbon fiber with a metal such as Ni or Cu. Ni is a ferromagnetic material and shows a satisfactorily high permeability in a low-frequency band region, but the permeability thereof is drastically reduced in a high-frequency band region, and thus to provide a shielding effect from an external magnetic field having a high frequency, the frequency dependency of the permeability of the covering metal must be improved.

The amorphous alloy of the present invention shows a high permeability even at a high frequency, and can shield a material from an electric field or magnetic field in a broad frequency band region. Furthermore, a metal or alloy-covered carbon fiber can be further covered with the amorphous alloy of the present invention. As the metal to be covered, there can be mentioned nickel, chromium, iron, gold, copper, aluminum, titanium, tellurium, silver, platinum, zinc, tin and lead, and any metals that can be electrolyzed can be used. Furthermore, alloys of at least two metals and alloys of at least one metal and a non-metal such as phosphorus or boron can be used.

Further, predetermined parts of a conductor pattern of a printed circuit board can be covered with the amorphous alloy of the present invention, as another example of the application of the amorphous alloy of the present invention.

The recent tendency toward a reduction of the size and weight and an increase of the density of electronic devices is severe, and the reduction of the weight, thickness, and size of various elements and parts of these devices is noticeable. Also, in a printed circuit board, the density and the number of elements and parts mounted on unit area of the printed circuit board have been increased, to impart a variety of functions thereto.

An electronic device is fabricated by mounting elements and parts on such a printed circuit board, or by connecting such printed circuit boards through cable lines or the like. When this electronic device is used, sometimes noise is generated from elements, parts or cable lines, and when fine and weak signals are precisely processed by parts or elements, the functions of the devices are disturbed by this noise to cause malfunctions. Moreover, the functions of these elements and parts per se are disturbed by this noise. In a printed circuit board having a highly increased density as described above, the space between conductor lines is very narrow and the distance between the part and element is particularly short. Accordingly, noise is picked up by such elements or parts, or they interfere with one another, and therefore, such parts and elements are influenced by one another. Currently, since the sizes of parts and elements have been reduced, the frequencies of signals to be processed have been raised, and the influence of noise further increased.

If a circuit pattern of a printed circuit board, which generates or picks up noise in the above-mentioned manner, is covered with the amorphous alloy of the present invention, noise can be absorbed and the above-mentioned problems can be prevented. This is because, where an electric current flows in the vicinity of a material having a high permeability, the flux emitted from the electric current is absorbed in the high-permeability material and the inductance is increased. Thus, the influences of noise can be eliminated by covering predetermined parts of a printed circuit board with the amorphous alloy of the present invention.

As pointed out above, the lowering of the magnetic characteristics at a high frequency is due predominantly to the eddy current. Accordingly, a thin film is prepared, and practically, a laminate of this thin film with a material having a high resistivity is used. The amorphous alloy of the present invention shows superior magnetic characteristics even when used alone, but a tape having a thickness of scores of m, which is formed by laminating the amorphous alloy of the present invention with a material having a high resistivity, can be used in various fields because the workability and productivity thereof are high. For example, a magnetic core is prepared by winding an amorphous alloy tape while forming an insulating layer thereon, and if a tape having such a laminated structure is directly used, this step can be simplified. The high-resistivity layer can be formed by chemically oxidizing the surface of the amorphous alloy of the present invention to form a metal oxide film, or by coating a metal oxide on the surface of the amorphous alloy of the present invention. Alternatively, an electroconductive polymer is formed on the surface of the amorphous alloy by electrolytic polymerization and a layer having a high resistivity is formed on the surface. Since these high-resistivity layers are not completely electrically insulative, the amorphous alloy can be further deposited thereon by adjusting the electrolysis conditions.

The process for forming an amorphous alloy film or covering film according to the present invention will now be described in detail.

When the amorphous alloy film of the present invention is prepared, iron, cobalt, and phosphorus constituting the amorphous alloy are supplied in the form of salts. As the iron salt, there can be used ferrous sulfate, ferrous chloride, iron sulfamate and mixtures thereof, and as the cobalt salt, there can be used cobalt sulfate, cobalt chloride, cobalt sulfamate, cobalt pyrophosphate and mixtures thereof. Phosphorous acid and/or a phosphite is used as the phosphorus source. Namely, a plating bath containing phosphorous acid or a phosphite alone or as a mixture of phosphorous acid and a phosphite is used. As specific examples of the phosphite, there can be mentioned potassium phosphite, ammonium hydrogenphosphite, sodium hydrogenphosphite, sodium phosphite, and magnesium phosphite.

To improve the film-forming property, it is necessary to incorporate at least one member selected from the group consisting of reducing agents and complexing agents. As the reducing agent, there can be used hydroquinone, hydrazine, dimethylamine borane, and sodium borohydride, and as the complexing agent, there can be mentioned citric acid, hydroxycarboxylic acid, EDTA, and gluconic acid.

An electroconductive metal or alloy is used for the working electrode, and where the formed amorphous alloy is peeled from the working electrode, a metal or alloy which is mirror-finished so that the center line average height of the surface is smaller than 1 $\mu$m, preferably 0.5 $\mu$m, is used as the working electrode. As the metal to be used for the working electrode, there can be mentioned iron, copper, brass, aluminum, stainless steel, and ITO glass. To prevent a degradation of the surface of the working electrode with the lapse of time, a metal or alloy having a surface covered with a hard chrome plating is preferably used.

The shape of the working electrode is not particularly critical, but when an amorphous alloy film is continuously prepared, a drum-shaped or belt-shaped working electrode is preferably used. The center line average height referred to in the present invention is determined according to JIS B-0601. If a working electrode which is surface-finished so that the surface roughness exceeds 1 $\mu$m is used, it is difficult to continuously prepare a separate uniform film having a thickness smaller than 20 $\mu$m.

In the present invention, an amorphous alloy composed of iron, cobalt, and phosphorus is formed on a working electrode, which is mirror-finished so that the surface roughness is less than 1 $\mu$m as pointed out above, in a plating bath containing phosphorous acid and/or a phosphite as the phosphorus source, and then the alloy is directly peeled from the working electrode to form a film, or is slit to form a foil, whereby the intended amorphous alloy film can be easily prepared. In the electrolysis for preparing the amorphous alloy of the present invention, the $Fe^{2+}$ concentration is adjusted to about 1/100 to about 3 moles/l, and the $Co^{2+}$ concentration is adjusted to about 1/100 to about 3 moles/l. When another metal (M) is incorporated according to need, the M ion concentration is adjusted to about 1/100 to about 3 moles/l, with the proviso that the relationship of about 1/10 mole/l$<$x+y+z$<$ about 3 moles/l (in which x is the $Fe^{2+}$ concentration, y is the $Co^{2+}$ concentration and z is the M ion concentration) is established. If the metal ion concentrations in the plating bath are below the above-mentioned range, the formation of the alloy film becomes difficult and the film-forming state is worsened. If the metal ion concentrations exceed the above-mentioned range, it is difficult to dissolve the salts of the metal ions, Most preferably, the $Fe^{2+}$ concentration is about 1/30 to about 1/10 mole/, the $Co^{2+}$ concentration is about 1/10 to about 1 mole/l, the M ion concentration is about 1/10 to about 1 mole/l, and the relationship of about 1/5 mole/l$<$x+y+z$<$ about 2 moles/l is established.

The concentration of phosphorous acid and/or a phosphite is preferably about 1/20 to about 5 moles/. If the phosphorous acid concentration is below this range, an amorphous alloy cannot be formed and the film-forming state is bad. If the phosphorous acid concentration exceeds the above range, the current efficiency is reduced and the film-forming state is worsened. Most preferably, the phosphorous acid concentration is about 1/10 to about ½ mole/l.

Preferably, the electrolysis deposition is carried at a pH value of 1.0 to 2.2, a current density of 1 to 40 A/dm$^2$ and a bath temperature of 20° to 80° C.

If the pH value is outside the above range and lower than 1.0, the generation of hydrogen on the working electrode is conspicuous, the current efficiency is reduced, and the plating deposition is becomes very poor. If the pH value exceeds 2.2, the current efficiency is increased, but the phosphorus content in the alloy is reduced and it becomes difficult to produce an amorphous structure. If the current density is below the above-mentioned range, the plating is difficult, and if the current density exceeds the above-mentioned range, stress is accumulated in the deposited film, and in an extreme case, cracking occurs. If the bath temperature is below the above-mentioned range, it is difficult to form a film having a very good surface smoothness, and if the bath temperature exceeds the above-mentioned range, a precipitate is readily formed in the plating bath and control of the plating bath becomes difficult. Most preferably, the pH value is 1.3 to 1.6 the current density is 3 to 20 A/dm$^2$, and the bath temperature is 40° to 60° C. A cobalt plate is preferably used as a counter electrode. The composition of the deposited alloy can be easily adjusted by controlling the composition of the electrolytic bath.

The present invention will now be described in detail with reference to the following examples, that by no means limit the scope of the invention.

In the following examples, the respective characteristics were determined by the following methods.

Observation of Amorphousness of Sample

Using an X-ray generator (Model RU-3V supplied by Rigaku Denki), scattering angles (2$\theta$) of from 30° to 60° were measured by Cu-K$\alpha$ rays through an Ni filter, and the amorphousness was based on the presence or absence of diffraction peaks attributed to crystals.

Measurement of Alloy Composition

A sample amorphous alloy was dissolved in 5 ml of nitric acid and distilled water was added to the solution so that the total amount was 100 ml. The liquid was subjected to quantitative analysis using an ICP emission spectral analysis apparatus (Model ICAP-575MK-II supplied by Nippon Jarrel Ash).

Measurement of Surface Smoothness

Using a tracer type surface roughness meter supplied by KOSAKA LABORATORY LTD, the surface roughness of an alloy tape was measured at 50 magnifications in the scanning direction and 10,000 magnifications in the roughness direction, and the central line average height (Ra) was calculated according to JIS B0601 (the cut-off value was 0.8 mm and the measurement length was 30 mm).

Quantitative Analysis of Ions

The quantitative analysis of ions in a plating bath was carried out by using a capillary isokinetic electrophoretic analysis apparatus (Model IP-3AD supplied by Shimazu Corporation).

Measurement of Permeability

Figure 3:
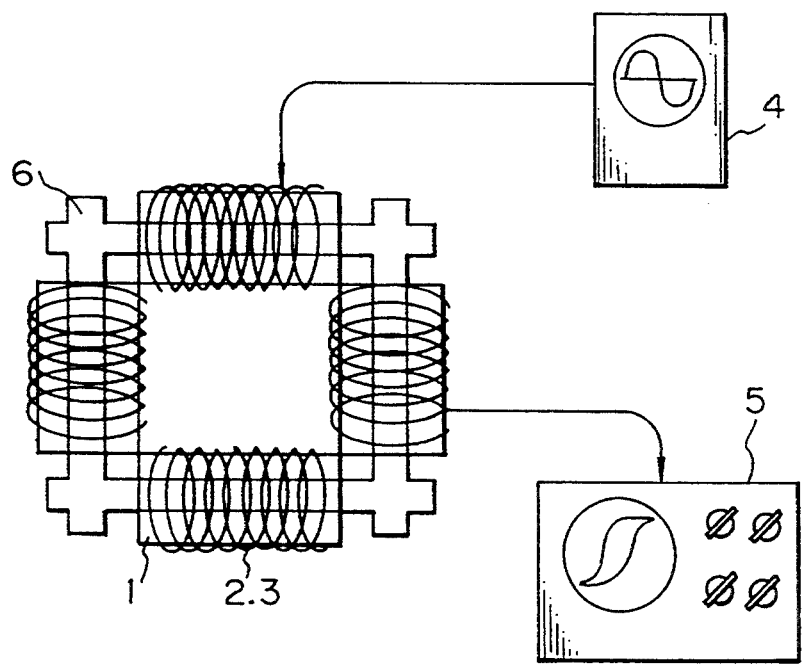
FIG. 3 illustrates an outline of an apparatus for measuring the permeability.

A secondary coil 3 of 80 turns and a primary coil 2 of 80 turns were wound on the inner side and outer side of a hollow plastic bobbin 1 having a diameter of 10 mm and a length of 2 cm, using an enamel wire having a diameter of 0.2 mm as shown in FIG. 3. Four enamel wire-wound bobbins were thus prepared and connected in series to one another, and were arranged as shown in FIG. 3. To cancel the induction electromotive force of an empty core, an alternating current of 1 KHz was applied to the primary coil 2 from an oscillator 4, and the induction electromotive force of the secondary coil 3 was measured by a voltage meter (oscilloscope) 5. Note, the permeability was calculated according to the following formulae:

$$H = \frac{4\pi \cdot N \cdot I}{10 \cdot L} \text{ (Oe)},$$

$$B = \frac{E}{4.44 \cdot f \cdot N \cdot A} \text{ (G), and}$$

$$\mu = \frac{B}{H} \text{ (G/Oe)}$$

wherein H represents the magnetizing force, B represents the flux density, N represents the winding number (320 turns) of the coils, I represents the electric current of the primary coil, L represents the magnetic path length, E represents the induction voltage of the secondary coil, f represents the frequency (1000 Hz), and A represents the sectional area (cm$^2$) of the sample.

The sample was cut to a width of 5 mm and a length of 4 cm and heat-treated at 200° C. for 5 minutes in a nitrogen atmosphere. Four test pieces were inserted into the bobbins 1, respectively, and the ends were placed in contact with one another to form a closed magnetic path.

Measurement of Initial Permeability

A sample was cut to a tape having a width of 5 mm, and a dispersion of an alumina powder (having a particle size of 1 μm) in an organic solvent was coated on one surface of the tape. The formed magnetic film was wound on a quartz tube having an outer diameter of 15 mm, a width of 5 mm and a thickness of 1 mm, and was annealed at 300° C. in a nitrogen atmosphere. An enamel wire having a diameter of 0.5 mm was wound for 20 turns on this quartz tube. The inductance and resistance were measured by a multi-frequency LCR meter (Model 4275A supplied by Yokogawa-Hewlett Packard, Ltd.) at a frequency of 10 KHz–10 MHz and an exciting current of 0.75 mA (as calculated under 4 mOe), and the initial permeability and tan δ were determined according to the following formulae:

$$\mu = \frac{L \cdot l \cdot 10^9}{4\pi n^2 S}, \text{ and}$$

$$\tan \delta = \frac{(R - R_0)}{\omega L}$$

wherein L represents the inductance (H), ω represents 2πf (f is the frequency), l represents the average magnetic path length (cm), n represents winding number, S represents the total sectional area (cm$^2$) of the magnetic film, R represents the measured effective resistance (Ω), and R$_0$ represents the resistance (Ω) of the wound wire.

Measurement of the Resistivity

The resistivity was measured at 4 terminals by a resistance meter (MCP-Tester EP supplied by Mitsubishi Yuka).

Example 1

Preparation of Amorphous Alloys A, B, C, D and E

The pH value of an aqueous solution containing 11.9 g/l of iron (II) chloride, 264.3 g/l of cobalt (II) sulfate, 164 g/l (2 moles/l) of phosphorous acid, 6.2 g/l of boric acid and 0.2 g/l of hydroquinone (reducing agent) was adjusted to 1.3, the electrolytic deposition was carried out at a current density of 5 A/dm$^2$, and the electrolysis time was changed to 2, 4, 9, 18, and 50 minutes, in the order of the amorphous alloys A, B, C, D and E, to obtain foils having different thicknesses. Each alloy was peeled from the electrode, and foils having a good pliability and no pinholes were obtained. An X-ray diffractometry showed that all of the alloys of the foils were amorphous. The X-ray diffraction chart of alloy C is shown in FIG. 12. When the alloy compositions of these samples were measured, it was found that all of the samples had substantially the same composition, the Fe/Co/P atomic ratio was 5/75/20 (atomic %), and the ratio of the atomic numbers of iron and cobalt contained was about 6/94.

Example 2

Preparation of Amorphous Alloy F

Nickel sulfate was added to the plating bath used in Example 1 so that the nickel sulfate concentration was 23.2 g/l, and the electrolytic deposition was carried out under the same conditions as described in Example 1. When the obtained alloy was subjected to the quantitative analysis, it was found that the Fe/Co/Ni/P atomic ratio was 4.3/69.1/10.1/16.5 (atomic %).

Example 3

Preparation of Amorphous Alloy G

The pH value of an aqueous solution containing 11.9 g/l of iron (II) chloride, 264.3 g/l of cobalt (II) sulfate, 6.2 g/l of boric acid and 126.0 g/l of sodium phosphite was adjusted to 1.3, and the electrolytic deposition was carried out at a current density of 5 A/dm². From the results of the X-ray diffractometry, it was confirmed that the formed alloy was amorphous, and from the results of the quantitative analysis, it was confirmed that the Fe/Co/P atomic ratio was 4.9/78.1/17.0 (atomic %).

Thus, it was confirmed that, even when using a phosphite, an amorphous alloy can be obtained in the same way as when a phosphorous acid is used.

Comparative Example 1

Preparation of Amorphous Alloy a

The pH value of an aqueous solution containing 29.8 g/l of iron (II) chloride, 238.9 g/l of cobalt (II) sulfate, 164 g/l (2 moles/) of phosphorous acid, 6.2 g/l of boric acid and 0.2 g/l of hydroquinone (reducing agent) was adjusted to 1.3, and the electrolytic deposition was carried out at a current density of 5 A/dm². The electrolysis time was 9 minutes, and a film having a thickness of about 9.4 μm was peeled from the electrode. A foil having no pinholes and an excellent pliability was obtained, and from the results of the X-ray diffractometry, it was found that the alloy was amorphous.

When the obtained amorphous alloy film was subjected to quantitative analysis, as for the amorphous alloy film F, it was found that the Fe/Co/P atomic ratio was 12/68/20 (atomic %), and the ratio of the atomic numbers of contained iron and cobalt was about 15/85.

Comparative Example 2

Figure 4:
FIG. 4 is a photo of the surface of an amorphous alloy formed by using hypophosphorous acid.

The pH value of an aqueous solution containing 11.9 g/l of iron (II) chloride, 264.3 g/l of cobalt (II) sulfate, 6.2 g/l of boric acid and 31.8 g/l (0.3 mole/l) of sodium hypophosphite was adjusted to 1.3, and the electrolytic deposition was carried out at a current density 5 A/dm². A photograph of the surface of the product deposited on the electrode is shown in FIG. 4. The film-forming property was poor and the formed product could not be peeled in the form of a separate film. When a test piece of the deposited product was stripped from the electrode and subjected to the quantitative analysis, it was found that the Fe/Co/P atomic ratio was 4.7/75.8/15.0 (atomic %).

Comparative Example 3

Preparation of Amorphous Alloy b

The pH value of an aqueous solution containing 11.9 g/l of iron (II) chloride, 264.3 g/l of cobalt (II) sulfate, 6.2 g/l of boric acid and 10.6 g/l (0.1 mole/l) of sodium hypophosphite was adjusted to 1.3, and the electrolytic deposition was carried out at a current density of 5 A/dm². The electrolysis time was 8 minutes, and a film having a thickness of 7 μm was obtained. From the results of the quantitative analysis, it was found that the Fe/Co/P atomic ratio was 4.4/84.1/11.5 (atomic %).

Example 4

Ion Analysis of Electrolytic Bath

The quantitative analysis of ions of the electrolytic bath (a) formed in Example 1 and the electrolytic bath (b) left after the electrolytic deposition was carried out, and the results are shown in Table 1 and the measurement charts are shown in FIGS. 5 and 6. From these results, it is seen that hypophosphorous acid and a trivalent iron ion were not present in the plating baths.

TABLE 1

|  | Plating Bath (a) | Plating Bath (b) |
| --- | --- | --- |
| phosphorous acid (g/l) | 5.09 | 5.08 |
| boric acid (g/l) | 6.00 | 6.00 |
| chloride ion (g/l) | 4.51 | 4.56 |
| sulfuric acid ion (g/l) | 93.51 | 94.26 |
| iron (g/l) | 3.00 | 3.01 |
| cobalt (g/l) | 56.26 | 55.03 |

Example 5

Relationship between Permeability and Film Thickness

Figure 7:
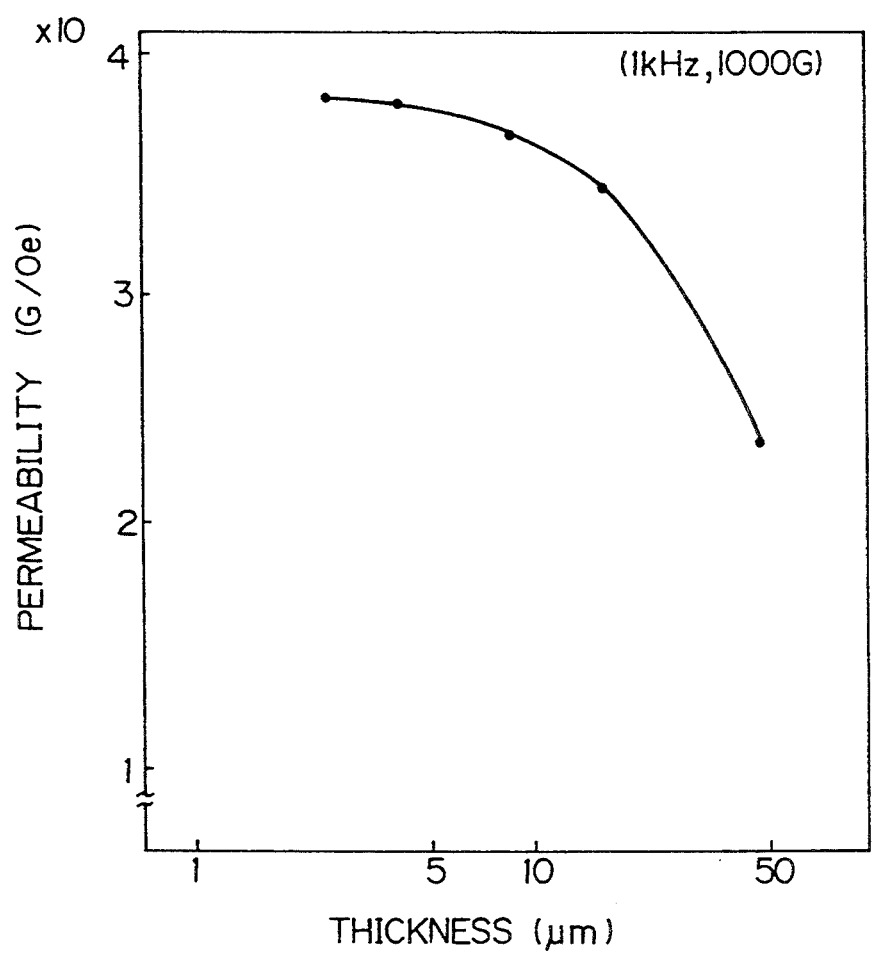
FIG. 7 shows the relationship between the thickness and permeability in an amorphous alloy.

The permeability of each of the amorphous alloys A, B, C, D and E, was measured at a frequency of 1 KHz and a flux density of 1000 G, and the results are shown in Table 2. The relationship between the film thickness and the measured permeability is shown in FIG. 7. It is seen that, when the thickness was less than 20 μm, especially 10 μm, the permeability was high. The data of the center line average height is also shown in Table 2.

TABLE 2

| Sample | Thickness (μm) | Permeability (G/Oe) | Center Line Average Height (μ) |
| --- | --- | --- | --- |
| A | 2.7 | 37,900 | <0.1 |
| B | 4.5 | 37,600 | <0.1 |
| C | 9.6 | 36,300 | 0.1 |
| D | 18.6 | 34,100 | 0.1 |
| E | 49.9 | 23,500 | 0.1 |

Example 6

Relation between Iron/Cobalt Ratio and Permeability

The permeability of the amorphous alloy a obtained in Comparative Example 1 was measured, and the results are shown in Table 3. It is seen that the amorphous alloy a had a much lower permeability than that of the amorphous alloy C obtained in Example 5, which had substantially the same thickness as that of the amorphous alloy a. Accordingly, it is evident that, if the content of cobalt is higher than 90% based on the sum of iron and cobalt, the amorphous alloy has a superior permeability.

TABLE 3

| Sample | Thickness (μm) | Permeability (G/Oe) | Center Line Average Height (μ) |
| --- | --- | --- | --- |
| a | 8.4 | 11,400 | 0.1 |

Example 7

Comparison with Amorphous Alloy Formed by Using Hypophosphorus Acid as Phosphorus Source The permeability of the amorphous alloy b obtained in Comparative Example 3 was measured, and the results are shown in Table 4. It is seen that the amorphous alloy b had a low permeability and a large center line average height.

TABLE 4

| Sample | Thickness (μm) | Permeability (G/Oe) | Center Line Average Height (μ) |
| --- | --- | --- | --- |
| b | 7.0 | 20,400 | 0.7 |

Example 8

Frequency Dependency of Initial Permeability

Figure 8:
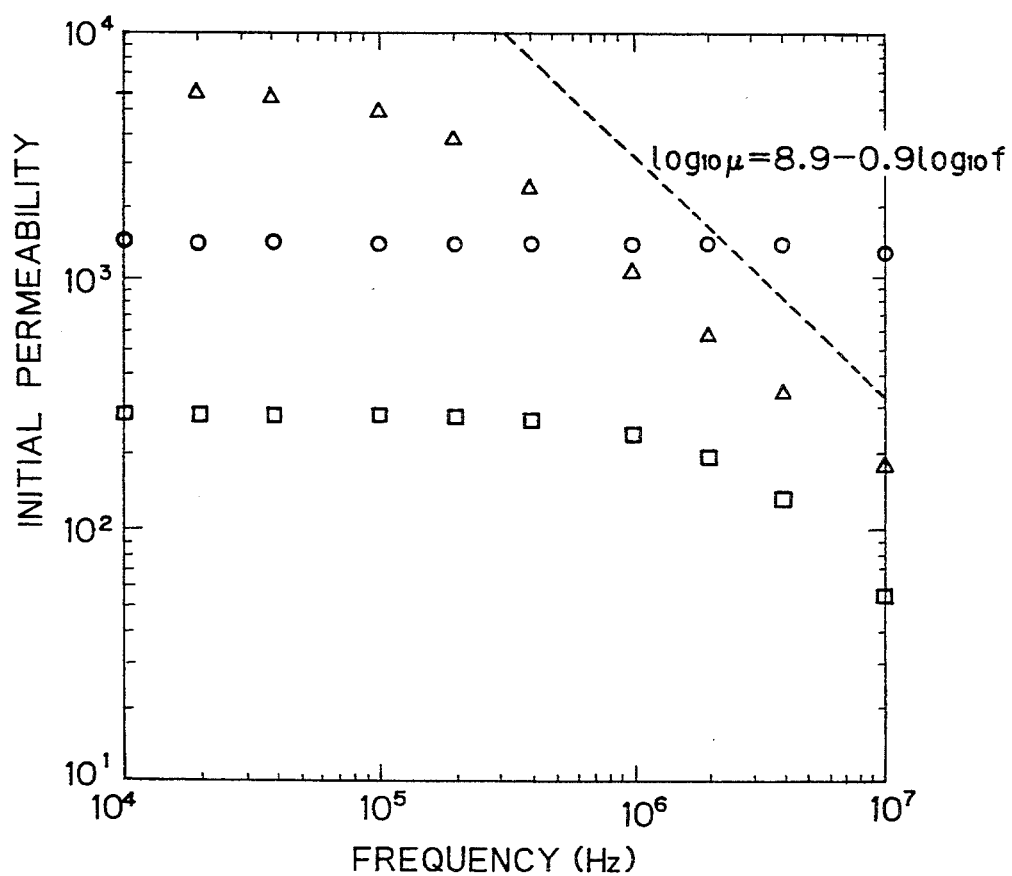
FIG. 8 shows the dependency of the initial permeability on the frequency.
Figure 9:
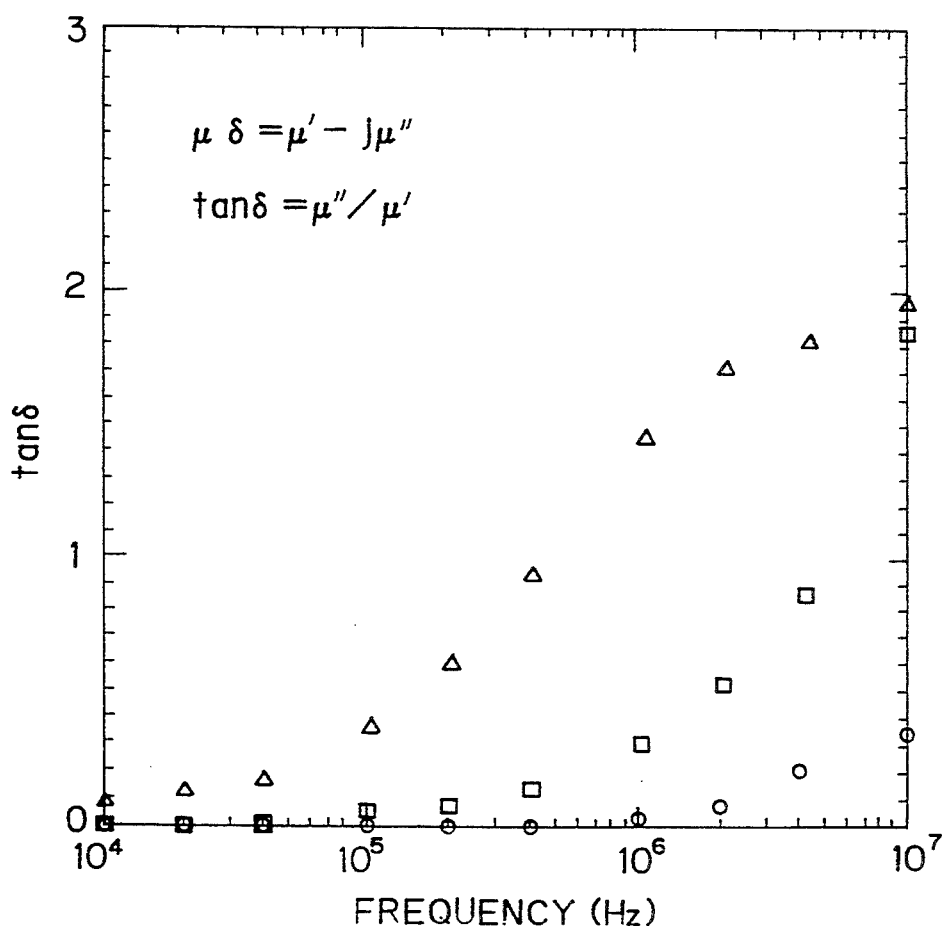
FIG. 9 shows the dependency of tan on the frequency.

The initial permeability and loss coefficient tan δ of each of the amorphous alloys A and b, and an amorphous alloy obtained by the rapid cooling process (METGLAS® 2714A supplied by NIPPON AMORPHOUS METALS CO., LTD.) as the comparative sample, were measured, and the results are shown in FIGS. 8 and 9.

In the amorphous alloy b and the comparative sample, a reduction of the initial permeability was observed even at a low frequency. In contrast, in the amorphous alloy A of the present invention, a reduction of the permeability was not observed at a frequency of up to 10 MHz. Furthermore, in the amorphous alloy A of the present invention, the value of tan δ was small, and it can be seen that the magnetic loss was small in this amorphous alloy.

Furthermore, the resistivity of each of the foregoing samples was measured, and the results are shown in Table 5. For comparison, the resistivity of a copper foil having a thickness of 20 μm was measured. It is seen that the resistivity of the amorphous alloy of the present invention was almost 100 times higher than that of the copper foil, and the eddy current at a high frequency was satisfactorily eliminated in the amorphous alloy of the present invention.

TABLE 5

| Sample | Thickness (μm) | Resistivity (μΩ-cm) |
| --- | --- | --- |
| amorphous alloy A | 2.7 | 100 |
| amorphous alloy b | 7.0 | 100 |
| comparative sample (rapid quenching process) | 25 | 150 |
| copper foil | 20 | 1.4 |

Example 9

Continuous Preparation of Amorphous Alloy Tape

An amorphous alloy tape was continuously prepared by using the same electrolytic bath as used in Example 1.

The outline of the plating apparatus used is shown in FIG. 11. An HCP-301H supplied by Hokuto Denko Corporation was used as the power source.

The plating aqueous solution having the composition described in Example 1 was charged in a plating bath tank 25, and a voltage was applied between a counter electrode 26 and a working electrode 21, each being composed of platinum, and the metals and the like were deposited on the working electrode. The surface of the drum-shaped working electrode 21 was mirror-finished so that the center line average height was smaller than 1.0 μm, and a hard chrome plating was formed on this finished surface. An electrolytic film 27 deposited on the drum was immediately peeled by a peeling drum 22, fed out by a feed-out drum 23, and wound by a winding drum 24.

The thickness of the electrolytic film depended on the residence time of the working drum in the plating bath. In this example, the residence time was adjusted to 2 minutes, and an endless amorphous alloy tape having a thickness of about 2 μm and a width of 25 mm was prepared. The prepared alloy tape had a good surface gloss and an excellent pliability.

Example 10

Formation of Covering Film on Carbon Fiber

To evaluate the electromagnetic wave-shielding effect of a covered carbon fiber, the covered carbon fiber was cut to a length of 6 mm, dispersed in an amount of 10% by weight in an epoxy resin, the dispersion was solidified to form a measurement sample having a thickness of 5 mm, and the damping factor was measured.

Preparation of Covering Film A

An aqueous solution containing 2 g/l of ferrous chloride, 27.8 g/l of cobalt sulfate, 0.6 g/l of boric acid and 10 g/l of phosphous acid was used as the plating bath. The electrolysis was carried out at a bath temperature of 60° C. and over potential of −2.5 A (vs Ag/AgCl). An HA-301 supplied by Hokuto Denko Corporation was used as the power source. The electrolytic solution having the above-mentioned composition was charged in an electrolytic bath tank, and a voltage was applied between a counter electrode and a working electrode, each composed of platinum, to deposit an iron/cobalt alloy on a carbon fiber. The thickness of the deposited alloy depended on the residence time of the carbon fiber in the plating solution. The surface of the alloy had a good surface gloss and the alloy had an excellent pliability. From the results of the X-ray diffractometry, it was found that there was no peaks attributable to a crystal, and that the alloy was amorphous.

Preparation of Covering Film a (Comparison)

Nickel was deposited on a carbon fiber by carrying out the electrolysis at a bath temperature of 50° C. and over potential of −2.5 V (vs Ag/AgCl) by using a plating bath containing 240 g/l of nickel sulfate, 45 g/l of nickel chloride and 30 g/l of boric acid. The shielding effect was evaluated by measuring the damping factor.

The results are shown in Table 6.

TABLE 6

| Sample | Field | Frequency | | |
| --- | --- | --- | --- | --- |
| | | 100 MHz | 300 MHz | 500 MHz |
| | | Damping Factor (dB) | | |
| Covering Film A | electric field | 43 | 44 | 39 |
| | magnetic field | 60 | 70 | 65 |
| Covering Film a (Comparison) | electric field | 59 | 60 | 60 |
| | magnetic field | 50 | 49 | 49 |

Example 11

Formation of Covering Film on Conductor Pattern of Printed Circuit Board

A pattern comprising two conductors having a length of 10 cm and arranged in parallel with a space of 0.2 mm therebetween was formed on an epoxy resin substrate to obtain a printed circuit board. An amorphous alloy was plated as the soft magnetic material on the printed circuit board under conditions described below. The pH value of an aqueous solution containing 2 g/l of iron chloride, 278 gl/ of cobalt sulfate, 6 g/l of boric acid and 21 g/l of phosphorous acid was adjusted to 1.4, and by using this solution as the plating bath, the electrolysis was carried out at over potential of −10 V for 4 minutes. The plating thickness was about 3 μm.

The soft magnetic metal-plated printed circuit was inserted into a sample portion 11 of a circuit as shown in FIG. 10. The wave height value was examined by an oscilloscope 11. In FIG. 10, reference numeral 12 represents an impulse noise simulator and reference numeral 13 represents a direct current power source.

For comparison, the wave height value of a sample on which the soft magnetic metal was not plated was similarly measured.

The damping factor of the soft magnetic metal-plated sample was determined according to the following formula:

$$\alpha(dB) = 20 \times \log \frac{Vo}{V}$$

wherein a represents the damping factor, V represents the wave height value of the soft magnetic metal-plated sample, and Vo represents the wave height value of the unplated sample.

As a result, it was found that the damping factor α was 5 dB, and thus it was confirmed that noise can be reduced by plating a soft magnetic metal.

Example 12

Preparation of Laminate of Amorphous Alloy and Electroconductive Polymeric Material Electrolytic Solution (A) for Formation of Amorphous Alloy Layer The pH value of an aqueous solution containing 11.9 g/l of iron (II) chloride, 264.3 g/l of cobalt (II) sulfate, 6.2 g/l of boric acid and 3.3 g/l of phosphorous acid was adjusted to 1.3.

Electrolytic Solution (B) for Formation of Polymer Layer

In acetonitrile as the solvent were dissolved 0.5 mole/l of lithium borofluoride as the supporting electrolyte and 0.5 mole/l of pyrrole as the monomer, and the solution was bubbled by nitrogen gas.

Deposition (a) of Amorphous Alloy Lyer

A stainless steel sheet which had been mirror-finished so that the center line average height was smaller than 0.1μ was used as the electrode, and in the electrolytic solution (A), the electrolytic deposition was carried out at a current density of 5 A/dm² and a temperature of 40° C. for 1 minute. Then, the formed amorphous alloy was peeled from the electrode to obtain a film having no pinholes and an excellent pliability.

When the thickness of the obtained electrolytic film was measured by using a β-ray type thickness meter (Model BTC-55 supplied by ELEC FINE INSTRUMENTS CO., LTD.), it was found that the thickness was 1.2 μm.

Form the results of the X-ray diffractometry, it was found that no sharp interference peak attributable to metal crystals existed and the film was amorphous.

Deposition (b) of Polymer Layer

By using the electrolytic solution (B) and the above-mentioned electrode, the anodic oxidation electrolytic polymerization was carried out for 2 minutes under a voltage of 1.0 V to a standard caromel electrode (SCE) with bubbling with nitrogen gas. A black polymer film was formed on the electrode, and the thickness of the polymer film was 0.2 μm as measured by the β-ray type thickness meter.

The resistivity of the obtained film was measured according to the four-terminal method using MPC-TESTER EP supplied by Mitsubishi Yuka, and it was found that the resistivity of the film was 1 to $10^{-2}$ Ω-cm.

The film was returned to the electrolytic solution (B), and the cathodic reduction was carried out for 1 minute under a reverse potential of −0.22 V to effect undoping. When the resistivity of the film was measured, it was found that the film was electrically insulative.

Preparation of Laminate Film

A first amorphous soft magnetic layer having a thickness of 1.2 μm was formed on the electrode under deposition conditions (a) of the amorphous soft magnetic layer, and a polymer layer having a thickness of 0.2 μm was formed on the first layer under deposition conditions (b) of the polymer layer. The deposition of the polymer layer was smoothly and effectively carried out even on the amorphous soft magnetic layer. Then, the amorphous soft magnetic layer was similarly electrolytically deposited on the polymer layer, and the amorphous soft magnetic layer was laminated with a good film-forming property as in the case of the first layer. This laminating operation was repeated five times to obtain a laminate film having a total amorphous soft magnetic layer thickness of 6.0 μm. When the laminate film was peeled from the electrode. No pinholes were found, and the pliability was very good. The flow of electricity between the front and back surfaces was examined by using a tester, and it was found that the quantity of current flow was very small.

As apparent from the foregoing description, the amorphous alloy foil film or covering film of the present invention can be used as a superior soft magnetic material, and this film has a very thin thickness and an excellent workability.

We claim:

1. A process for preparing an amorphous alloy, which comprises carrying out an electrolytic deposition in an electrolyte bath containing at least a divalent cobalt ion, a divalent iron ion, a member selected from the group consisting of reducing agents and complexing agents, and phosphorous acid and/or a phosphite, the phosphorous acid and/or a phosphite being present in an amount of 1/20 to 5 mol/l, the bath having a pH of 1.0 to 2.2, the electrolytic deposition being conducted at an electric current density of 1 to 40 A/dm², so as to deposit on a working electrode an amorphous, soft magnetic alloy containing at least iron, cobalt and phosphorous, wherein the amorphous alloy contains at least 69 atomic % cobalt and 3 to 30 atomic % phosphorous, and the iron/(cobalt+iron) atomic ratio therein is from 0.001 to 0.1.

2. A process for preparing an amorphous alloy according to claim 1, wherein a metal having a surface which is mirror-finished so that the center line average roughness of the surface is less than 1 μm is used as the working electrode; and the amorphous alloy formed on the electrode is peeled from the electrode so as to obtain a tape-shaped or foil-shaped amorphous alloy having a thickness of not more than 20 μm.

3. A process for the preparation of an amorphous alloy according to claim 2, wherein the metal surface of the working electrode is a hard chrome-plated surface.

* * * * *